United States Patent
Lee et al.

(10) Patent No.: US 7,096,371 B2
(45) Date of Patent: Aug. 22, 2006

(54) CIRCUIT APPARATUS WITH EXTENDING GENERAL PURPOSE INPUT OUTPUT PIN

(76) Inventors: Kuan-Yu Lee, No. 97, Sec. 2, Changan Rd., Shituen Chiu, Taichung (TW); Chen-Ho Lee, 4F, No. 53, Alley 1050, Ming-Hu Rd., HsinChu (TW)

( * ) Notice: Subject to any disclaimer, the term of this patent is extended or adjusted under 35 U.S.C. 154(b) by 471 days.

(21) Appl. No.: 10/077,847

(22) Filed: Feb. 20, 2002

(65) Prior Publication Data

US 2003/0026217 A1    Feb. 6, 2003

(30) Foreign Application Priority Data

Aug. 3, 2001    (TW) ................ 90119092 A

(51) Int. Cl.
*G06F 1/26* (2006.01)
*G06F 13/00* (2006.01)

(52) U.S. Cl. ............ 713/300; 713/310; 713/192; 365/185; 358/444

(58) Field of Classification Search ........... 365/185; 713/300, 192, 310; 358/444
See application file for complete search history.

(56) References Cited

U.S. PATENT DOCUMENTS

| | | | | |
|---|---|---|---|---|
| 4,334,287 A | * | 6/1982 | Wiedenman et al. ....... 710/36 |
| 4,737,931 A | * | 4/1988 | Ishii ..................... 711/157 |
| 5,867,733 A | * | 2/1999 | Meyer ..................... 710/74 |
| 5,983,025 A | * | 11/1999 | Derrick et al. ............. 710/39 |
| 6,307,776 B1 | * | 10/2001 | So et al. ................ 365/185.03 |
| 6,433,607 B1 | * | 8/2002 | Kawasaki et al. ......... 327/299 |
| 6,445,636 B1 | * | 9/2002 | Keeth et al. ............ 365/222 |
| 6,593,930 B1 | * | 7/2003 | Sheaffer et al. ......... 345/531 |

OTHER PUBLICATIONS

74HC/HCT244 Data Sheet; Philips, Jan. 1993.*

* cited by examiner

*Primary Examiner*—Thomas Lee
*Assistant Examiner*—Vincent Tran
(74) *Attorney, Agent, or Firm*—Berkeley Law & Technology Group

(57) ABSTRACT

A circuit apparatus of extending General Purpose Input Output pins, which includes a control processing unit, a memory, and a buffer. Wherein, data pins of the control processing unit is coupled to memory pins of the memory and those in the buffer. Input signals can be temporarily stored in the buffer when the buffer is used as a buffer for inputting signals. And the buffer can feed input signals into the control processing unit while the memory is being recharged. Likewise, if the buffer is used as a buffer for outputting signals, the buffer can receive output signals (So) from the control processing unit and output those signals while the memory is being refreshed.

26 Claims, 1 Drawing Sheet

CIRCUIT APPARATUS WITH EXTENDING GENERAL PURPOSE INPUT OUTPUT PIN

This application incorporates by reference applicants' Taiwan application Serial No. 90119092, filed on Aug. 3, 2001.

BACKGROUND OF THE INVENTION

1. Field of the Invention

The invention relates to a controlled circuit, and more particularly to a circuit apparatus with General Purpose Input Output pin.

2. Description of the Related Art

As the pace of progress in technology, the peripherals of computer systems tend to become multiple. In these years, multi media facility, which is for capturing sound and vision, is the most popular one in computer peripherals. Therefore, every manufacturer would cudgel brains to devise the most attractive products for consumers in order to contend for possession of the market in such a competing market of multi media facilities. Let's take a scanner as an example. Since being effective is what modern people concern, an easily operated, handy and convenient scanner must be more welcome by consumers than one with complex operating schedules. There would be high market value to devise an easy-operated scanner with multi functions.

A highly competitive scanner must include a control processing unit with powerful functions to deal with complicated operating tasks. Nowadays, an Application Specific Integrated Circuit, ASIC, is used as a control processing unit to meet designs' requirements. On the practical applications, ASIC enables a scanner to proceed with a vision scan, a vision processing, enlargement, miniature, data input, data output and so on. That is why there are many pins and complex controls in ASIC. Among those pins, researchers can use General Purpose Input Output Pin, GPIO, as an entry of data delivery. For example, when a user presses a functional button of a scanner, the scanner can feed the input signal into ASIC through the pins of GPIO for further processing then the scanner can perform a reaction to the input signal. Likewise, for outputting data, a scanner can also use ASIC to output data through the pins of GPIO for further data processing.

Due to highly competition in the modern scanner market, every manufacturer would have to provide a scanner not only with basic scanning functions but also with additional multiple functions, which can play as competitive distinction and increase the possession ratio of the market. For example, in order to increase additional value of a scanner, a modem scanner can also provide multiple functions such as photo copy, fax, transmitting electric vision and so on. There is one thing needed to be aware of Although the additional functions of a scanner bring users a lot of convenience, in the hardware design of the scanner, it also need more GPIO pins in ASIC in order to meet the requirements of multiple functions. For instance, a scanner originally uses an ASIC with 100 pins. There are only 6 pins left for GPIO pins after deduction pins for necessary functions. Due to the increase of function buttons, a scanner needs more GPIO pins (like 10 pins). Therefore, a manufacturer has to use an ASIC with 104 pins. But, as the limitation of package techniques, the number of ASIC pins can not increase as many as needed. For example, the number can only be increased in 100, 125, and so on. Therefore, a manufacturer has to adopt an ASIC with 125 pins as the ASIC of a scanner. It would not only waste those not used pins, but also increase the cost of the product, and decrease the product usage of that product.

SUMMARY OF THE INVENTION

It is therefore an object of the invention to provide a circuit apparatus with extending General Purpose Input Output pins to extend original functions of GPIO pins and reduce production cost.

The invention achieves the above-identified objects by providing a circuit apparatus with extending General Purpose Input Output pins, which includes a control processing unit, a memory and a buffer. Wherein, data pins of a control processing unit are coupled to pins of a memory and a buffer. If a buffer is used as a buffer for inputting signals, input signals can be temporarily stored in the buffer. While a memory receives a recharging signal for refreshment, a control signal enables a buffer to feed input signals into a control processing unit during the interval of recharge of the memory. Likewise, if a buffer is used as a buffer for outputting signals, output signals from a control processing unit can be fed into a buffer and send out while a memory is being refreshed. Therefore, the pins of a control processing unit and a memory can achieve the function of GPIO. That is why this kind of circuit of apparatus can be called a circuit apparatus with extending General Purpose Input Output pins.

BRIEF DESCRIPTION OF THE DRAWINGS

Objects, features, and advantages of the invention will become apparent from the following detailed description of the preferred but non-limiting embodiments. The description is made with reference to the accompanying drawings, in which.

DESCRIPTION OF THE PREFERRED EMBODIMENT

Figure 1:
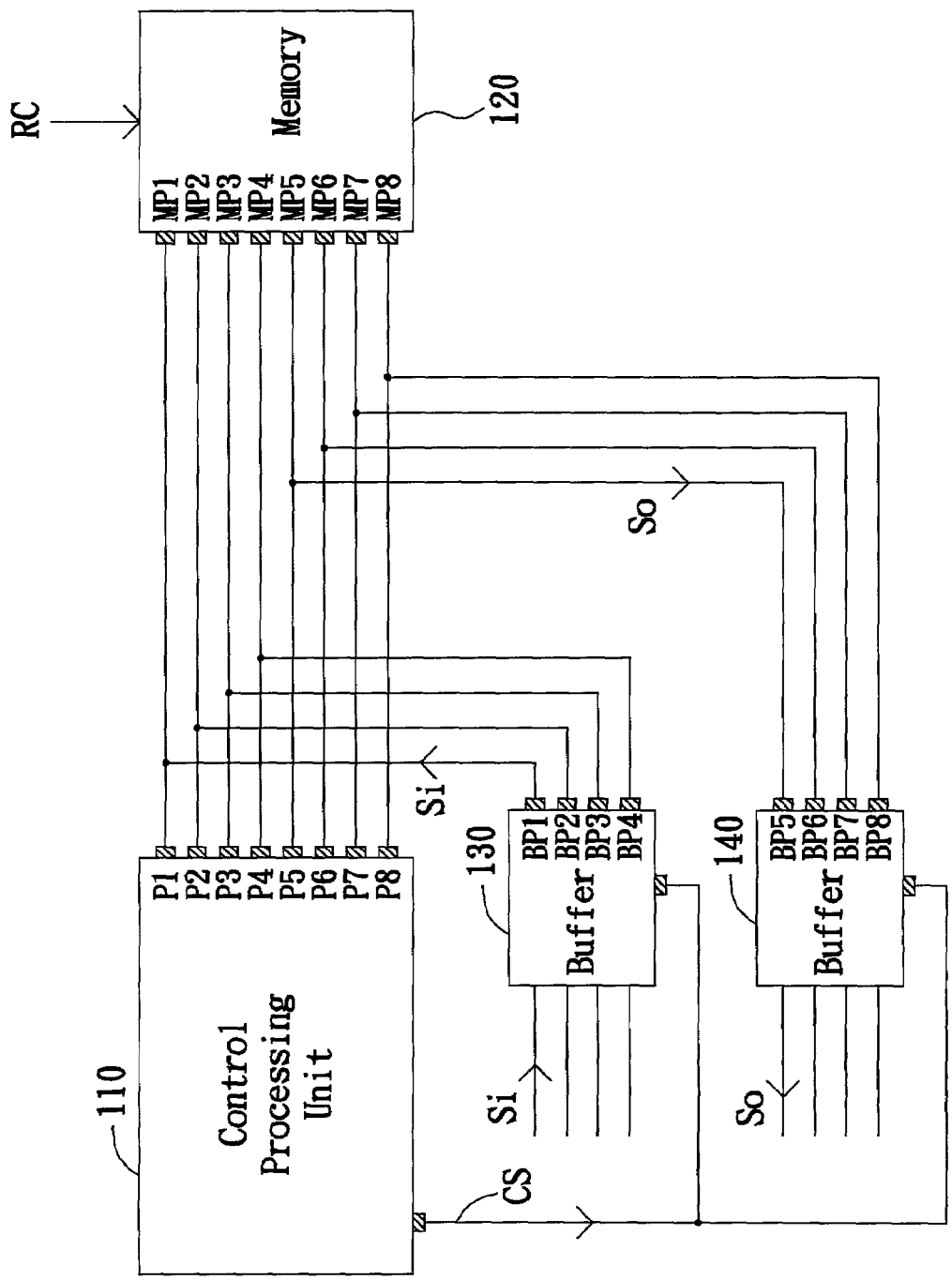
FIG. 1 is an illustration that shows the circuit apparatus with extending General Purpose Input Output pins according to the preferred embodiment of the invention.

Please refer to FIG. 1 It illustrates the circuit apparatus with extending General Purpose Input Output pins according to the preferred embodiment of the invention. In this FIGURE, a control processing unit 110 like an Application Specific Integrated Circuit (ASIC), is coupled to a memory 120. As it is shown in the FIGURE, there are data pins P1, P2, P3, P4, P5, P6, P7, and P8 in a control processing unit. Those pins also individually connect with the memory pins, MP1, MP2, MP3, MP4, MP5, MP6, MP7, and MP8 in the memory 120. In addition, one thing, which should be aware of, is that a memory 120 in the FIGURE has a character for refreshment, such as a Dynamic Random Access Memory (DRAM). Therefore, in order to maintain stored data in Memory 120 without loss, a recharging signal (RC) would cyclically recharge the memory 120.

Generally speaking, the bus between the control processing unit 110 and the memory 120 is for data delivery between the memory 120 and the control processing unit 110. However, there is no data transmitted between the memory 120 and the control processing unit 110 when recharging signal, RC refreshes the memory 120. It means the bus is free at that time. The invention uses such a spare time when the memory 120 is recharging, to feed input signals into the data pins of a control processing unit through the bus, or transfer output signal from a control and processing one through the bus. Therefore, this kind of circuit apparatus can be called a circuit apparatus with extending GPIO pins. The detail description of its embodiment is made as following.

In practical application, pins of the buffer 130, which are BP1, BP2, BP3, and BP4, can be coupled to the pins of the control processing unit 110, which are P1, P2, P3, and P4, and to receive control signal, CS, from the control processing unit, as it is shown in the FIGURE. One thing that needs to be aware of is a control signal (CS) is designed to be synchronized with the recharging signal (RC). Therefore, when the memory 120 is being recharged, the control signal CS would enable a buffer 130 and let the buffer 130 in an active situation. While the buffer 130 is in an active situation, the control processing unit 110 can also detect changes of situation in pins of the buffer 130. If there is any temporarily stored input signal (Si) in a buffer previously, when the buffer 130 is enabled, the input signal Si can be fed into the control processing unit 110. The control processing unit 110 can then further process data according to the input signal Si. That is, the buffer 130 is used as an input signal buffer at this moment. And, the control processing unit 110 can receive signals from data pins, P1, P2, P3, and P4, as input signals and process them.

Let's take the buffer 130 as an example of an input signal buffer. When a user presses a start button of scanning, the buffer 130 would latch the input signal (Si) first, and wait until the memory 120 receives a recharging signal RC and starts to be recharged. While the memory 120 is being recharged, the control processing unit 110 will feed a control signal (CS) into the buffer 130 to enable it and transfer input signals Si into the data pin (P1) of the control processing unit. Then, a control processing unit can further process on input signal Si. Briefly, the data pin P1 is applied as a pin to receive input signals Si for the control processing unit 110 while the memory 120 is being recharged. Since the time span of pressing a button (such as about 100–400 ms) is general much longer than the span of a refreshing cycle of a memory (like about 7 ms), an input signal Si can definitely be detected by the control processing unit. Beside, the buffer 130 must be a buffer which action situation can be controlled by external signals such as a control signal CS. For example the buffer model 74HC/HCT244 is a right one.

On the other hand, pins (BP5, 5P6, 5P7 and BP8) of a buffer 140 can individually connect with data pins of the control processing unit 110 electrically, and also receive a control signal (CS) from a control processing unit, as is shown in the FIGURE. While a memory 120 is being recharged, a control signal (CS) can enable the buffer 140 and let the buffer 140 in an active situation. While the buffer is in an active situation, the control processing unit 110 can feed an output signal (So) from a data pin P5 into the buffer 140, and transfer the output signal (So) through the buffer 140. That is, the buffer 140 is used as an output signal buffer, such as Model TC74HC374 buffer, and data pins of a control processing unit (P5, P6, P7, and P8) are applied as the outlets of signals.

In short, because that not only this kind of circuit apparatus can use the existent bus to process data delivery while a memory is being refreshed, it means that data pins of the control processing unit 110 can not only access data of the memory 120, but also this kind of circuit apparatus can be used as pins of GPIO while a memory is being recharged, therefore, this circuit apparatus can be named as a circuit apparatus with extending GPIO pins. One thing, which needs to be noticed, is that control signals CS of the buffer 130 and 140 are not necessarily limited to be sent from the control processing unit 110. The control signals can be sent from other units to achieve the same function.

The above embodiment reveals that the invention, a circuit apparatus with extending General Purpose Input Output pins, can flexibly increase General Purpose Input Output pins of an Integrated Circuit. Thus, the production cost will be less and the product usage will be improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus comprising:
   a scanner memory, having a plurality of memory pins;
   a control processing unit having a plurality of data pins, wherein at least one of the plurality of data pins is coupled to at least one of the plurality of memory pins; and
   a buffer, coupled to at least one of the plurality of data pins, wherein the buffer is adapted to provide data signals to the at least one of the plurality of data pins according to a control signal synchronized with a recharging signal provided to the scanner memory.

2. The apparatus according to claim 1, wherein the control processing unit is comprises an Application Specific Integrated Circuit (ASIC).

3. The apparatus according to claim 1, wherein the buffer comprises a model 74HC/HCT244 buffer.

4. The apparatus according to claim 1, wherein the scanner memory comprises a Dynamic Random Access Memory.

5. The apparatus with according to claim 1, wherein the control signal is provided by the control processing unit.

6. The apparatus of claim 1, wherein at least a portion of the plurality of data pins comprise General Purpose Input Output (GPIO) pins.

7. The apparatus of claim 1, wherein at least a portion of said data signals are provided to at least a portion of the plurality of data pins of the control processing unit substantially coincident with the recharging signal provided to the scanner memory.

8. An apparatus comprising:
   a scanner memory, having a plurality of memory pins;
   a control processing unit having a plurality of data pins, wherein at least one of the plurality of data pins is coupled to at least one of the plurality of memory pins; and
   a buffer, coupled to one or more of the plurality of data pins, wherein the buffer is adapted to receive an output signal provided from one or more of the plurality of data pins, wherein the buffer outputs the output signal according to a control signal synchronized with a recharging signal provided to the scanner memory.

9. The apparatus according to claim 8, wherein the control processing unit is comprises an Application Specific Integrated Circuit (ASIC).

10. The apparatus according to claim 8, wherein the buffer comprises a model TC74HC374 buffer.

11. The apparatus according to claim 8, wherein the scanner memory comprises Dynamic Random Access Memory.

12. The apparatus according to claim 8, wherein the control signal is provided by the processing unit.

13. The apparatus of claim 1, wherein the buffer is further adapted to receive data signals from one or more of the plurality of data pins according to a control signal synchronized with a recharging signal provided to the memory.

14. The apparatus of claim 8, wherein the buffer is further adapted to receive data signals from one or more of the plurality of data pins according to a control signal synchronized with a recharging signal provided to the memory.

15. The apparatus of claim 8, wherein at least a portion of the plurality of data pins comprise General Purpose Input Output (GPIO) pins.

16. The apparatus of claim 8, wherein at least a portion of said data signals are provided to at least a portion of the plurality of data pins of the control processing unit substantially coincident with the recharging signal provided to the scanner memory.

17. A scanner, comprising:
   a bus;
   a buffer communicatively coupled to the bus,
   a memory-communicatively coupled to the bus, wherein the memory is adapted to receive a recharge signal; and
   a control processing unit communicatively coupled to the bus, wherein the control processing unit is adapted to generate a control signal responsive to the recharge signal provided to the memory, to enable data transfer between the buffer and the control processing unit, wherein the data transfer is synchronized with the recharge signal provided to the memory.

18. The scanner of claim 17, wherein the control processing unit comprises an Application Specific Integrated Circuit (ASIC).

19. The scanner of claim 17, wherein the scanner memory comprises Dynamic Random Access Memory.

20. The scanner of claim 17, wherein the buffer is further adapted to receive data signals from the control processing unit according to a control signal synchronized with a recharging signal provided to the memory.

21. The scanner of claim 20, wherein the control processing unit further comprises a plurality of data pins adapted to provide the data signals to the buffer, wherein at least a portion of the data pins comprise General Purpose Input Output (GPIO) pins.

22. A method of accessing a control processing unit of a scanning device, comprising:
   providing an input signal to a buffer of the scanning device;
   determining whether a recharge signal is being provided to a memory of the scanning device; and
   enabling data transfer of at least a portion of the input signal between the buffer and the control processing unit, wherein the data transfer is synchronized with the recharge signal provided to the memory.

23. The method of claim 22, wherein the control processing unit comprises an Application Specific Integrated Circuit (ASIC).

24. The method of claim 22, wherein the scanner memory comprises Dynamic Random Access Memory.

25. The method of claim 22, wherein the buffer is further adapted to receive data signals from one or more data pins of the control processing unit according to a control signal synchronized with a recharging signal provided to the memory.

26. The method of claim 25, wherein at least a portion of the data pins comprise General Purpose Input Output (GPIO) pins.

* * * * *